(12) United States Patent
Lee et al.

(10) Patent No.: US 9,159,632 B2
(45) Date of Patent: Oct. 13, 2015

(54) FABRICATION METHOD OF SEMICONDUCTOR APPARATUS

(71) Applicant: SK hynix Inc., Gyeonggi-do (KR)

(72) Inventors: Young Ho Lee, Gyeonggi-do (KR);
Seung Beom Baek, Gyeonggi-do (KR)

(73) Assignee: SK Hynix Inc., Gyeonngi-do (KR)

( * ) Notice: Subject to any disclaimer, the term of this patent is extended or adjusted under 35 U.S.C. 154(b) by 62 days.

(21) Appl. No.: 13/845,770

(22) Filed: Mar. 18, 2013

(65) Prior Publication Data
US 2014/0179069 A1      Jun. 26, 2014

(30) Foreign Application Priority Data
Dec. 26, 2012  (KR) .......................... 10-2012-0153522

(51) Int. Cl.
*H01L 21/8234*   (2006.01)
*H01L 21/84*     (2006.01)
*H01L 27/12*     (2006.01)
*H01L 21/762*    (2006.01)

(52) U.S. Cl.
CPC ............ *H01L 21/84* (2013.01); *H01L 21/7624* (2013.01); *H01L 27/1203* (2013.01)

(58) Field of Classification Search
CPC ....... H01L 45/06; H01L 45/16; H01L 45/144; H01L 45/1233; H01L 27/2436; H01L 27/2463
USPC .......................................... 438/238; 257/379
See application file for complete search history.

(56) References Cited

U.S. PATENT DOCUMENTS

| | | | |
|---|---|---|---|
| 8,796,781 B2* | 8/2014 | Lee et al. | 257/379 |
| 2009/0166602 A1* | 7/2009 | Kum | 257/4 |
| 2011/0204424 A1* | 8/2011 | Arasawa et al. | 257/288 |
| 2011/0294278 A1* | 12/2011 | Eguchi et al. | 438/401 |
| 2012/0231607 A1* | 9/2012 | Lee et al. | 438/458 |
| 2013/0187233 A1* | 7/2013 | Yun et al. | 257/368 |
| 2013/0203221 A1* | 8/2013 | Cheng et al. | 438/151 |
| 2013/0241000 A1* | 9/2013 | Lee et al. | 257/379 |

FOREIGN PATENT DOCUMENTS

| | | |
|---|---|---|
| KR | 1020090088009 | 8/2009 |
| KR | 1020100120038 | 11/2010 |

* cited by examiner

*Primary Examiner* — Telly Green
(74) *Attorney, Agent, or Firm* — IP & T Group LLP

(57) ABSTRACT

A method of fabricating a semiconductor apparatus includes forming an insulating layer on a semiconductor substrate, forming a source post in the insulating layer, and forming a semiconductor layer over the source post and the insulating layer.

12 Claims, 8 Drawing Sheets

FABRICATION METHOD OF SEMICONDUCTOR APPARATUS

CROSS-REFERENCES TO RELATED APPLICATION

The present application claims priority under 35 U.S.C. 119(a) to Korean application number 10-2012-0153522, filed on Dec. 26, 2012, in the Korean Intellectual Property Office, which is incorporated herein by reference in its entirety.

BACKGROUND

1. Technical Field

The inventive concept relates to a semiconductor integrated apparatus, and more particularly, to a fabrication method of a semiconductor apparatus 2. Related Art Various researches on improvement of integration density in semiconductor memory apparatuses have been progressed. As an example, there are vertical diodes or vertical transistors.

In vertical switching devices, pillars have to be formed to have a sufficient thickness to improve off-current characteristic or an effective channel length. However, the high height of the pillar causes an aspect ratio to be increased so that the process of forming the device has difficulty and leaning of the pillar occurs.

Thus, horizontal channel transistors have been suggested and will be described with reference FIGS. 1 to 6.

FIGS. 1 to 6 are cross-sectional views illustrating a method of fabricating a related semiconductor apparatus.

First, as illustrated in FIG. 1, a common source region 103 having a predetermined depth is formed in an upper surface of a semiconductor substrate 101. The common source region 103 may be formed, for example, through $N^+$ type impurity implantation. Further, the common source region 103 may be formed after an active region is formed in a subsequent process.

Subsequently, a sacrificial layer 105 having a predetermined thickness and a first semiconductor layer 107 having a predetermined thickness are sequentially formed on the semiconductor substrate 101 including the common source region 103. The sacrificial layer 105 and the first semiconductor layer 107 includes semiconductor material layers having different etch selectivity from each other. For example, the sacrificial layer 105 may include silicon germanium (Site) and the first semiconductor layer 107 may include silicon (Si). Both of the sacrificial layer 105 and the first semiconductor layer 107 may be formed through an epitaxial growth method to have a perfect crystalline state.

As illustrated in FIG. 2, a photoresist pattern (not shown) is formed on a predetermined region of the first semiconductor layer 107, and the first semiconductor layer 107 and the sacrificial layer 105 are patterned in the same shape of the photoresist pattern to form a hole 109 exposing a surface of the common source region 103.

After the hole 109 is formed, a native oxide layer is completely removed and a heat treatment is performed at a predetermined temperature in an ambient of hydrogen. When the heat treatment is performed at a predetermined temperature in an ambient of hydrogen, the first semiconductor layer 107 is flowed to be filled in the hole, and a second semiconductor layer 111 is formed as illustrated in FIG. 3.

After the second semiconductor layer 111 is formed, a hard mask (not shown) is formed in a direction (the same direction as a direction of the device illustrated in FIG. 3) perpendicular to a formation direction of a gate line to be formed in a subsequent process, and the second semiconductor layer 111 and the sacrificial layer 105 are patterned to confine an active region. As described above, the common source region may be formed after the confining of the active region.

When an active region ACT is defined, as illustrated in FIG. 4, the sacrificial layer 105 is removed along the exposed surface, and an insulating layer 113 is formed in a space in which the sacrificial layer is removed to form a local silicon-on-insulator (SOI) structure. The semiconductor substrate as illustrated in FIG. 5 may be referred to as a local SOI substrate or a local SOI wafer.

As illustrated in FIG. 6, a word line 115 is formed on the active region ACT through a gate formation process and impurities are implanted into the active region ACT at both sides of the word line 115 to form a source region C and a drain region D. At this time, the source region S is a region electrically connected to the semiconductor substrate 101, specifically, the common source region 103, and the drain region D is a region on the insulating layer 113.

As described above, the fabricating of the horizontal transistor flows the first semiconductor layer to form the second semiconductor layer 111. At this time, a flowing state of the first semiconductor layer 107 may be changed according to a surface state of the semiconductor substrate 101, a pattern density, and a line/spacer pattern size. Therefore, the active region may be formed to have a uniform thickness.

Further, when the flowing process of the first semiconductor layer 107 is unstable, electrical defects occur. Since lattice constants of the first semiconductor layer 107 and the sacrificial layer 105 are different, lattice defects may occur in the epitaxial growth process for forming the first semiconductor layer 107 on the sacrificial layer 105 or in the heat treatment process for flowing the first semiconductor layer.

The insulating layer 113 buried below the active region ACT after the removing of the sacrificial layer 105 may include an insulating material such as a spin on dielectric (SOD) which is easily etched in a wet etchant. Therefore, when forming a word line 115 in a subsequent process, controlling of a width in the word line 115 is difficult since etch characteristic of a structure of the word line 115 is different from that of the insulating layer.

Further, the SOT substrate fabricated through the above-described method is high-priced and thus costs of SOT-based memory devices and apparatuses are also increased.

SUMMARY

A method of fabricating an exemplary semiconductor apparatus may include: forming an insulating layer on a semiconductor substrate; forming a source post in the insulating layer; and forming a semiconductor layer over the source post and the insulating layer.

The semiconductor layer may include a semiconductor layer grown from the source post.

These and other features, aspects, and implementations are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
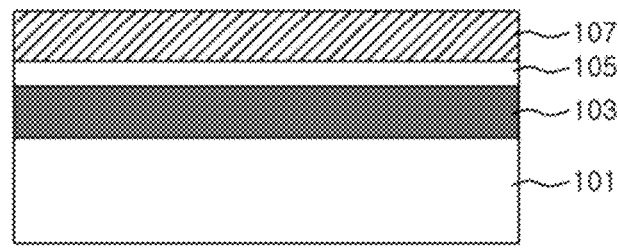
FIGS. 1 to 6 are cross-sectional views illustrating a method of fabricating a related high-integration semiconductor memory apparatus.
Figure 2:
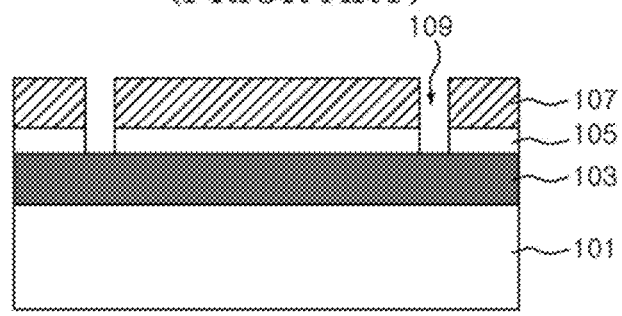
Figure 3:
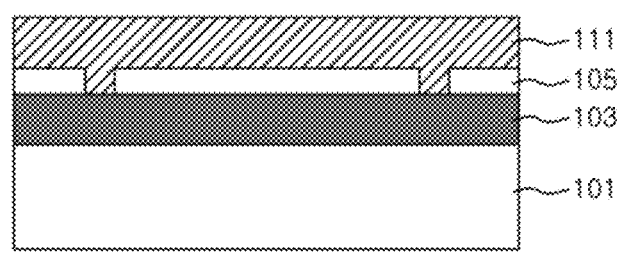
Figure 4:
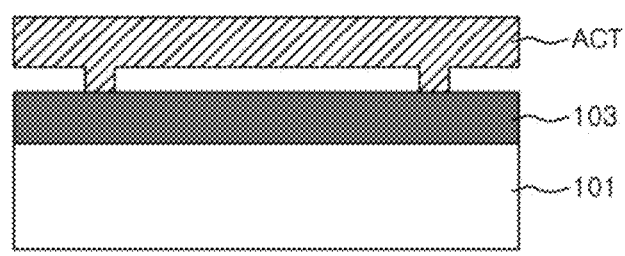
Figure 5:
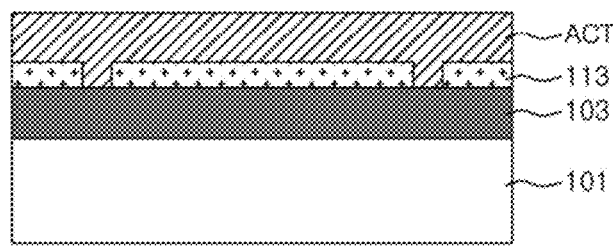
Figure 6:
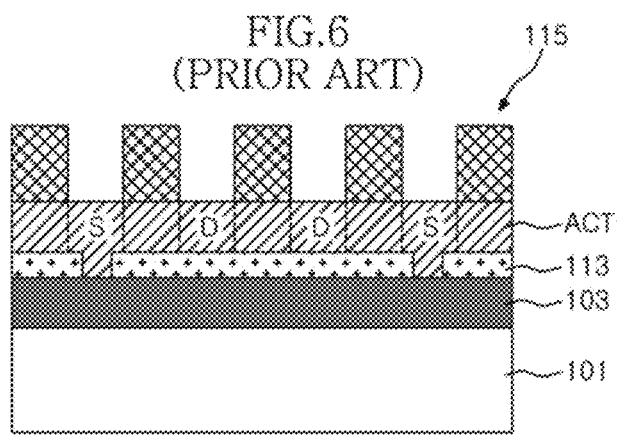

Hereinafter, exemplary implementations will be described in greater detail with reference to the accompanying drawings.

Exemplary implementations are described herein with reference to cross-sectional illustrations that are schematic illustrations of exemplary implementations (and intermediate structures). As such, variations from the shapes of the illustrations as a result, for example, of manufacturing techniques and/or tolerances, are to be expected. Thus, exemplary implementations should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 7 to 10 are cross-sectional views illustrating a method of fabricating an exemplary semiconductor apparatus.

Figure 7:
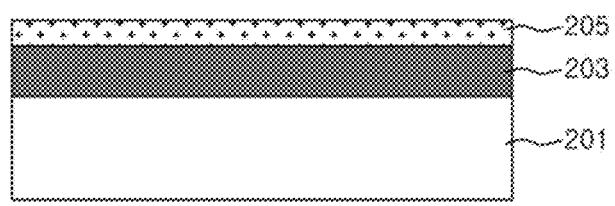
FIGS. 7 to 10 are cross-sectional views illustrating a method of fabricating an exemplary semiconductor apparatus.

Referring to FIG. 7, a common source region 203 is formed on a semiconductor substrate 201, and an insulating layer 205 is formed on the common source region 203. The common source region 203 may be formed after a final active region is formed. The common source region 203 may be formed by implanting an $N^+$ type impurity. In particular, a concentration of phosphorous (P) ions or arsenic (As) ions may be implanted in a range of about $1 \times 10^{14}$ atoms/cm$^3$ or more, so that the common source region 203 has low resistance and thus, has high operation current. The common source region 203 may be thermally treated under an appropriate condition to allow silicon single crystalline silicon to be smoothly grown in the following formation process of a semiconductor layer The insulating layer 205 may be formed using an oxide layer or a nitride layer. The insulating layer 205 may be formed to a thickness of about 50 Å to about 1000 Å to significantly insulate the common source region 203 from an active region.

Figure 8:
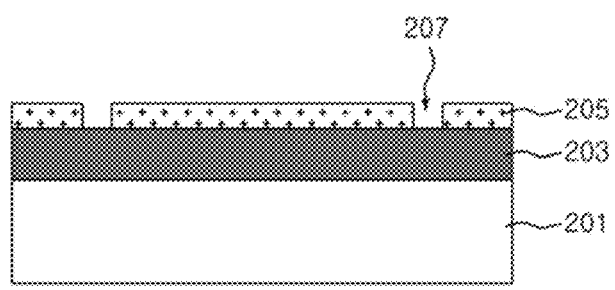

Subsequently, after a photoresist pattern (not shown) formed on the insulating layer 205, as illustrated in FIG. 8, the insulating layer 205 is patterned using the photoresist pattern to form a source post formation region 207 exposing a surface of the semiconductor substrate 201 or the common source region 203.

After the source post formation region 207 is formed, a cleaning process may be performed on the exposed surface. The cleaning process may be performed in a wet or dry method. Alternatively, a wet method and a dry method may be performed in-situ. A native oxide layer or other impurities on the exposed surface are completely removed through the cleaning process. Further, a material (gas or solution) having good etch selectivity to a material constituting the insulating layer 205 may be used in the cleaning process to minimize loss of the insulating layer 205.

Figure 9:
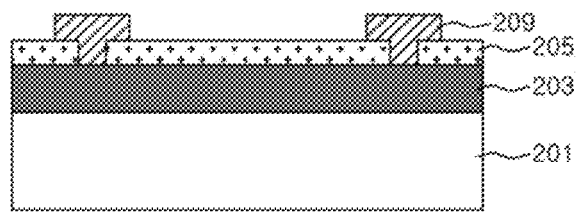

A source post 209 may be formed from the exposed semiconductor substrate 201 or the exposed common source region 203 through an epitaxial method, as illustrated in FIG. 9.

Figure 10:
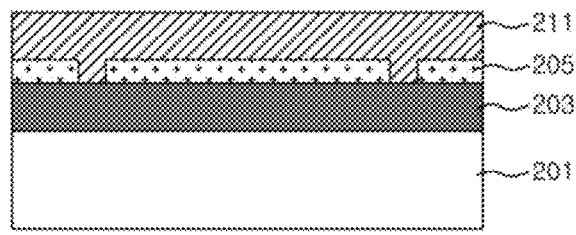

As illustrated in FIG. 10, the source post 209 is consecutively grown and a semiconductor layer 211, having a predetermined thickness, is formed to entirely cover the gate insulating layer 205. The thickness of the source post 209 is based on a desired thickness of an active region. The post source 209 may grown to a thickness greater than a desired thickness of the active region, and then polished so that a desired thickness remains.

The source post 209 and the first semiconductor layer 211 may be formed by, for example, low pressure chemical vapor deposition (LPCVD), plasma-enhanced CVD (PECVD), ultrahigh vacuum CVD (UHVCVD), rapid thermal CVD (RTCVD), atmosphere pressure CVD (APCVD), or molecular beam epitaxy (MBE).

The cumbersome processes of forming and removing a sacrificial layer below the semiconductor layer and forming an insulating layer are eliminated by the above-described process of forming the SOI substrate (wafer). Further, since the semiconductor layer 211 is grown in a state in which an insulating layer such as an oxide layer or a nitride layer is disposed below the semiconductor layer 211, an occurrence of lattice defects may be prevented.

Figure 11:
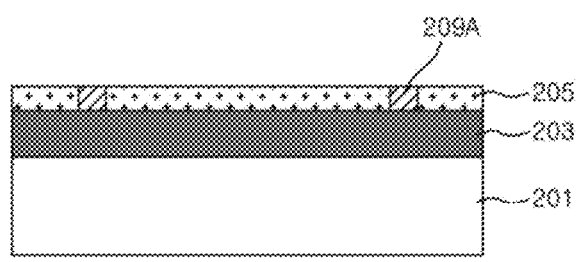
FIGS. 11 to 13 are cross-sectional views illustrating a method of fabricating an exemplary semiconductor apparatus.
Figure 12:
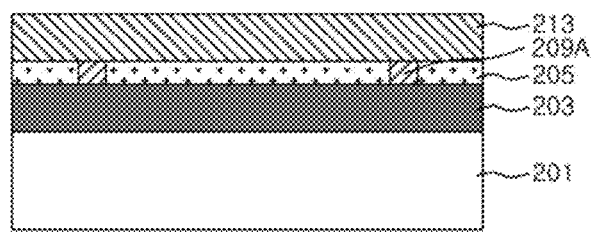
Figure 13:
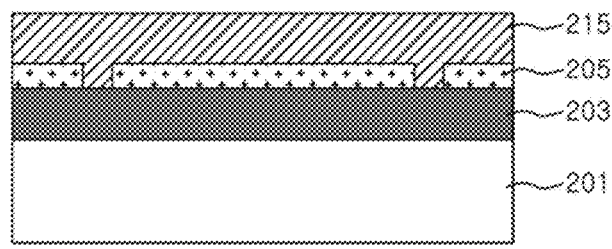

FIGS. 11 to 13 are cross-sectional views illustrating a method of fabricating an exemplary semiconductor apparatus, including a process of forming an insulating layer 205 to processes of patterning a source post formation region and forming a source post are similar to the processes illustrated in FIGS. 7 to 9. In particular, the source post 209 may be formed to single crystal silicon.

After the source post 209 is formed, the source post 209 is planarized to expose an upper surface of the insulating layer 205, and as illustrated in FIG. 11, a buried source post 209A is formed.

As illustrated in FIG. 12, an amorphous semiconductor layer 213, having a predetermined thickness, is formed on the semiconductor substrate having the buried source post 209A. Before forming the amorphous semiconductor layer 213, a cleaning process for cleaning a top of the insulating layer 205 and a top of the buried source post 209A may be performed and the amorphous semiconductor layer 213 may be formed to have the same single crystal silicon as the buried source post 209A.

The cleaning process may be performed using a wet or dry method, which may be performed in-situ. A native oxide layer or other impurities on the exposed surface are completely removed by the cleaning process. Further, a material having a low etch selectivity for a material constituting the insulating layer 205 may be used in the cleaning process to minimize loss of the insulating layer 205.

The amorphous semiconductor layer 213 may be formed at a temperature of about 600° C. or less, and the amorphous semiconductor layer 213 is may be formed so that a portion on the top of the buried source post 209A is a single crystal silicon and a portion on the insulating layer 205 is amorphous.

Subsequently, the amorphous semiconductor layer 213 is crystallized through a heat treatment process to form a semiconductor layer 215 as illustrated in FIG. 13. Specifically, the semiconductor layer 213 may be formed from the buried source post 209A through a solid phase epitaxy (SPE) method.

The heat treatment process on the amorphous semiconductor layer 213 may be performed so that recrystallization of the amorphous semiconductor layer 213 formed on the insulating layer 205 is suppressed and crystallization is made from a seed of the amorphous semiconductor layer 213 formed on the top of the buried source post 209A toward the portion of the amorphous semiconductor layer on the insulating layer 205. For the heat treatment process, a long heat treatment method at a low temperature, a laser annealing method, or the like may be used.

In the exemplary implementation, the source post 209, which becomes the buried source post 209A may be formed by, for example, LPCVD, very low pressure CVD (VLPCVD), PECVD, UHVCVD, RTCVD, APCVD, or MBE equipment.

Further, the semiconductor layer 215 may be formed based on a desired thickness of an active region and may be planarized to cause a surface state to be uniform.

FIGS. 14 to 17 are cross-sectional views illustrating a method of fabricating an exemplary semiconductor apparatus.

Figure 14:
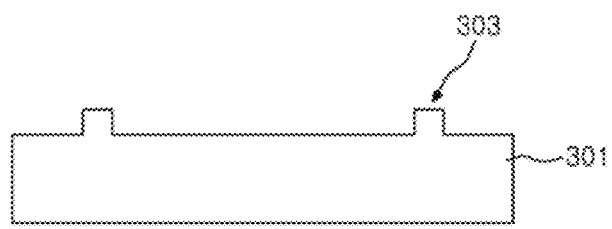
FIGS. 14 to 17 are cross-sectional views illustrating a method of fabricating an exemplary semiconductor apparatus.

First, as illustrated in FIG. 14, a semiconductor substrate 301 is patterned to form a source post 303 protruding from a predetermined portion of the semiconductor substrate 301. The source post 303 is patterned based on a height of an insulating layer to be formed in a subsequent process. The source post 303 may be patterned to a depth of about 50 Å to about 1000 Å.

Figure 15:
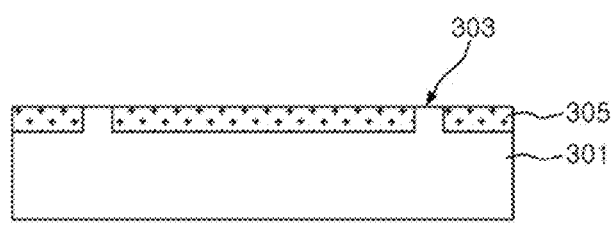

As illustrated in FIG. 15, an insulating layer 305 is formed on the semiconductor substrate 301, including the source post 303, and planarized is to expose a surface of the source post 303.

Figure 16:
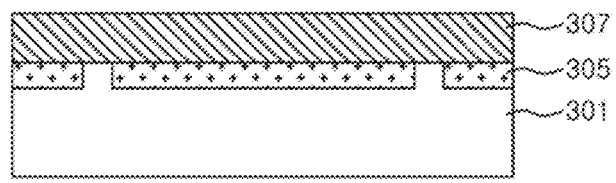

After the insulating layer 305 is formed, an amorphous semiconductor layer 307 is formed on the semiconductor substrate, including the planarized insulating layer 305, as illustrated in FIG. 16. The amorphous semiconductor layer 307 may be formed at a temperature of about 600° C. or less. The amorphous semiconductor layer 307 may be formed so that a portion on a top of the source post 303 is a single crystal silicon and a portion on the insulating layer 305 is amorphous.

Figure 17:
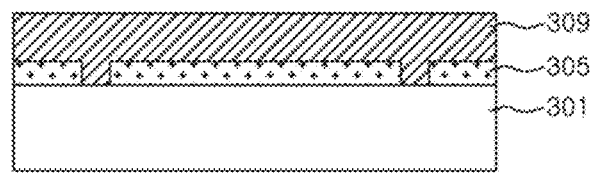

Subsequently, the amorphous semiconductor layer 307 is crystallized through a heat treatment process to form a crystalline semiconductor layer 309 as illustrated in FIG. 17. Therefore, a SOI structure is completed.

The heat treatment process on the amorphous semiconductor layer 307 may be performed so that recrystallization of the amorphous semiconductor layer 307 formed on the insulating layer 305 is suppressed and crystallization is made from a seed of the amorphous semiconductor layer 307 formed on the top of the source post 303 toward the portion of the amorphous semiconductor layer 307 on the insulating layer 305. For the heat treatment process, a long heat treatment method at a low temperature, a laser annealing method, or the like may be used.

Before the amorphous semiconductor layer 307 is formed, a cleaning process may be performed. The cleaning process may be a wet or dry method, which may be performed in-situ. A native oxide layer or other impurities on an exposed surface are completely removed in the cleaning process. Further, a material having a low etch selectivity to a material constituting the insulating layer 305 may be used in the cleaning process to minimize loss of the insulating layer 305.

In the exemplary implementation, before the source post 303 is formed, a process of forming a common source region may be. The common source region may be formed by doping an $N^+$ type impurity.

Further, the semiconductor layer 309 may be formed based on a desired thickness of an active region and may be planarized to cause a surface state to be uniform.

FIGS. 18 to 22 are cross-sectional views illustrating a method of fabricating a semiconductor apparatus according to a fourth exemplary implementation of the inventive concept.

The method of fabricating a semiconductor apparatus in the exemplary implementation may be regarded as a modified example of the method of fabricating an exemplary semiconductor apparatus illustrated in FIGS. 14 to 17. The exemplary implementation illustrates an example in which the source post 403 is previously formed before a common source region is formed. Specifically, the exemplary implementation illustrates an example in which the common source region is formed of a metal material.

Figure 18:
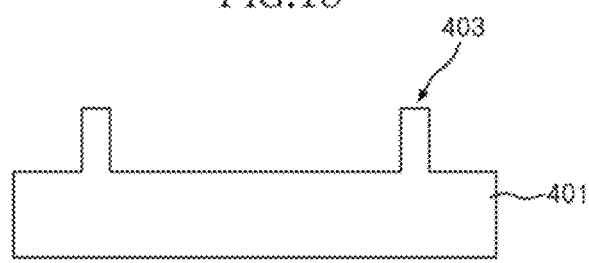
FIGS. 18 to 22 are cross-sectional views illustrating a method of fabricating an exemplary semiconductor apparatus.

Referring to FIG. 18, a predetermined region of a semiconductor substrate 401 is patterned to form a source post 403. A height of the source post 403 may be based on a thicknesses of a common source region and an insulating layer which are to be formed in subsequent processes.

Figure 19:
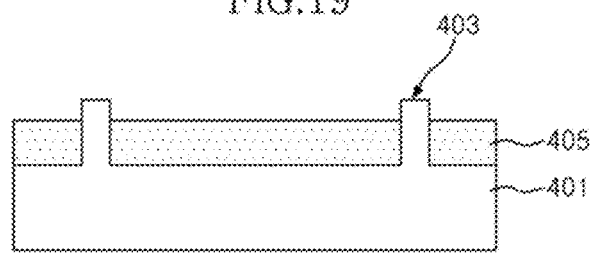

As illustrated in FIG. 19, a conductive material is formed on the semiconductor substrate including the source post 403 and then recessed to a predetermined height to form a common source region 405. The common source region 405 is formed to have a smaller height than a height of the source post 403. Therefore, after forming the common source region 405, the source post 403 has a protruding portion having a predetermined height corresponding to the height of the insulating layer, which will be formed in a subsequent process.

Figure 20:
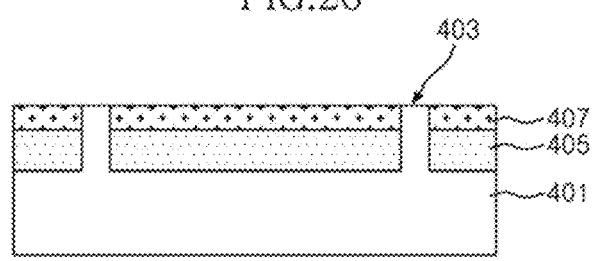

An insulating layer 407 is deposited on the semiconductor substrate 401, including the common source region 405, and then planarized to expose a surface of the source post 403 to form a structure as illustrated in FIG. 20.

Figure 21:
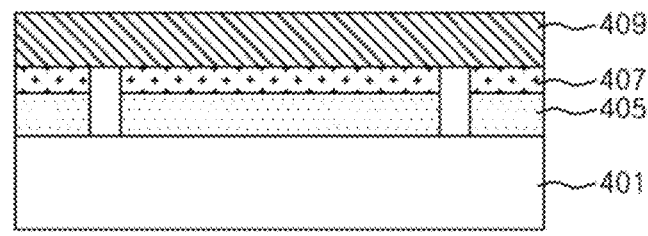
Figure 22:
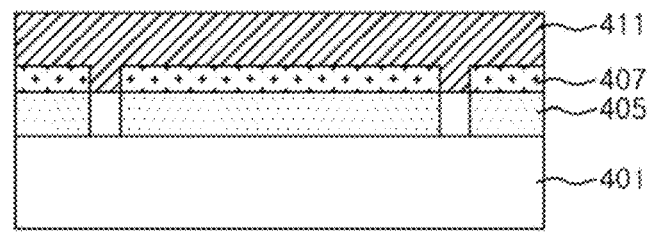

As illustrated in FIG. 21, an amorphous semiconductor layer 409 is formed on the semiconductor substrate 401, including the structure, and the amorphous semiconductor layer 409 is thermally processed to form a crystalline semiconductor layer 411 as illustrated in FIG. 22. A pre-processing process (a cleaning process), which may be performed before forming the amorphous semiconductor layer 409, the processes of forming the amorphous semiconductor layer 409 and the semiconductor layer 411, and a post-processing process (a heat treatment) are similar to the processes described with reference to FIGS. 16 and 17 and detailed description thereof will be omitted.

After the SOI substrate (wafer) is formed as described above, a horizontal channel transistor may be formed and the forming of the horizontal channel transistor will be described with reference to FIGS. 23 to 26.

FIGS. 23 to 26 are cross-sectional views illustrating a method of fabricating a semiconductor memory apparatus to which the inventive concept is applied.

After a crystalline semiconductor layer 211, 215, 309, or 411 is formed by one of the previously described methods, a hard mask (not shown) is formed on the crystalline semiconductor layer 211, 215, 309, or 411 in a direction perpendicular to a gate line formation direction. The crystalline semiconductor layer 211, 215, 309, or 411 and the insulating layer 205, 305, or 407 is patterned to define an active region ACT. A common source region may be formed after the active region ACT is defined.

Figure 23:
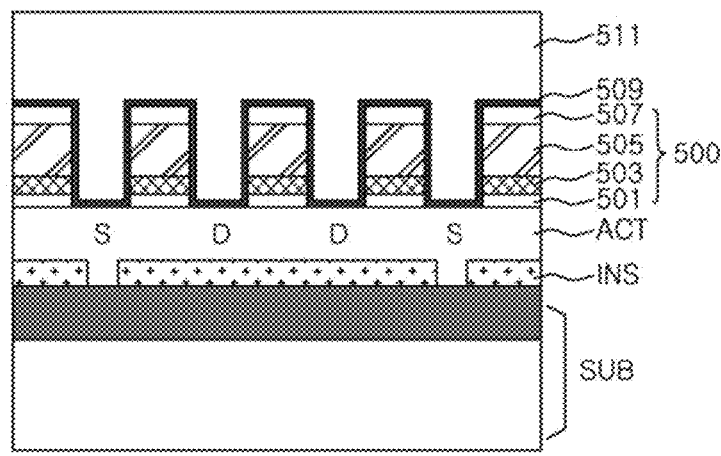
FIGS. 23 to 26 are cross-sectional views illustrating a method of fabricating an exemplary a semiconductor memory apparatus.

FIG. 23 illustrates an exemplary implementation a state in which an active region ACT is formed on a semiconductor substrate SUB including an insulating layer INS.

Subsequently, referring to FIG. 23, after the active region ACT is defined, a gate insulating layer 501 is formed on an exposed surface of the active region ACT, a gate conductive layer 503, a barrier conductive layer 505, and a hard mask 507 are sequentially formed on the gate insulating layer 501. The hard mask 507, barrier conductive layer 505, and gate conductive layer 503 are patterned in a line shape to be perpendicular to the active region ACT to form a word line 500.

Further, a spacer insulating layer 509 is formed on the semiconductor substrate SUB, including the word line 500, and an impurity is implanted at both sides of the word line 500 to form a source region S and a drain region D. An interlayer insulating layer 511 is formed to a predetermined height.

Figure 24:
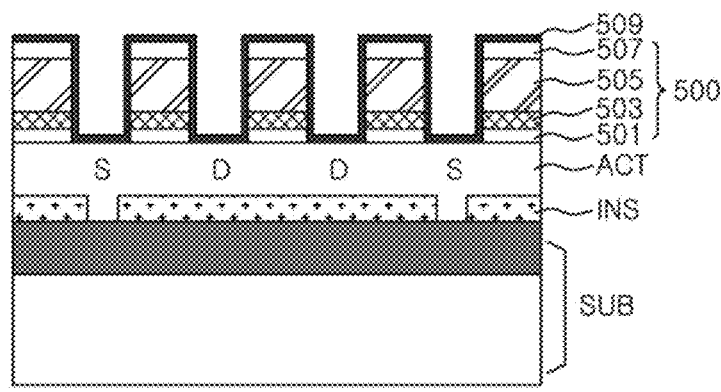

As illustrated in FIG. 24, a photoresist pattern (not shown) is formed on the interlayer insulating layer 511 between active regions to expose a portion of the interlayer insulating layer 511 corresponding to the active regions ACT, and the exposed interlayer insulating layer 511 is removed. (Although not shown in FIG. 24, the interlayer insulating layer 511 remains between the active regions ACT and the photoresist patterns are removed.

Figure 25:
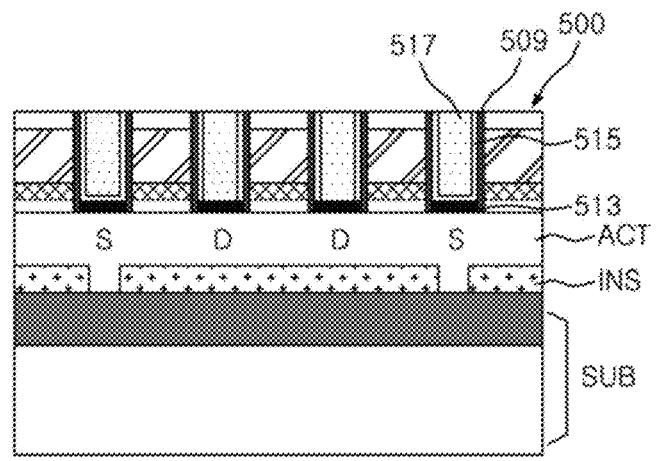

As illustrated in FIG. 25, an etching process is performed on the spacer insulating layer 509 to form a spacer 509 on a sidewall of the word line 500. An electrode 513, an insulating spacer 515, and a data storage material 517 are formed in a space on the source region S between the word lines 500, and in a space on the drain region D between the word lines 500. At this time, the data storage material 517 on the source region S is insulated from the electrode 513 by the spacer 515 and the data storage material 517 on the drain region D is in contact with the electrode 513.

Figure 26:
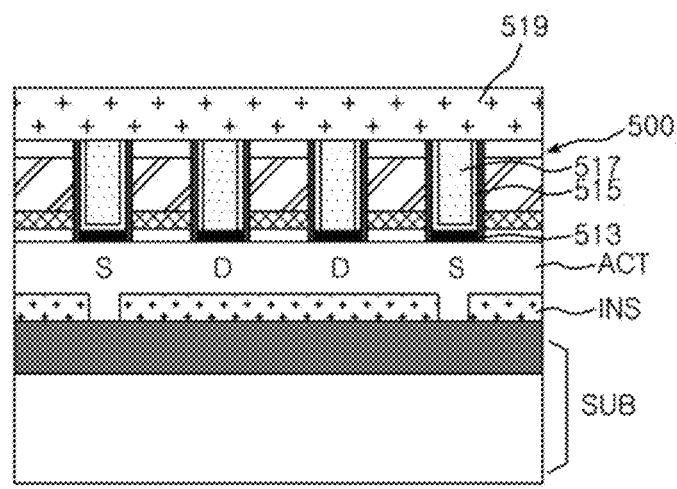

When a unit memory cell is completed by the forming of the data storage material 517, as illustrated in FIG. 26, an interconnection layer electrically connected to the data storage material 517, that is, a bit line 519 is formed.

FIGS. 23 to 26 illustrated an example of the method of fabricating an exemplary horizontal channel transistor. However, the SOI substrate fabricated by the inventive concept is not limited to a bottom structure of the horizontal channel transistor but may be a bottom structure of all applicable semiconductor apparatuses.

The above implementation of the present invention is illustrative and not limitative. Various alternatives and equivalents are possible. The invention is not limited by the implementation described herein. Nor is the invention limited to any specific type of semiconductor device. Other additions, subtractions, or modifications are obvious in view of the present disclosure and are intended to fall within the scope of the appended claims.

What is claimed is:

1. A method of fabricating a semiconductor apparatus, the method comprising:
   forming an insulating layer on a semiconductor substrate;
   patterning the insulating layer to expose the semiconductor substrate;
   forming a source post from the exposed semiconductor substrate in the insulating layer; and
   forming a semiconductor layer directly over the whole of the semiconductor substrate having the source post and the insulating layer,
   wherein the insulating layer remains without being removed.

2. The method of claim 1, wherein the forming a semiconductor layer over the whole of the semiconductor substrate having the source post and the insulating layer further comprises:
   growing the semiconductor layer from the source post.

3. The method of claim 1,
   wherein forming the source post further comprises:
   growing the source post from the exposed semiconductor substrate to a height greater than or equal to a height of the insulating layer.

4. The method of claim 1, wherein the forming the insulating layer further comprises:
   patterning the semiconductor substrate to form the source post;
   forming the insulating layer on the semiconductor substrate, including the source post; and
   planarizing the insulating layer to expose an upper surface of the source post.

5. The method of claim 1, wherein the forming the insulating layer further comprises:
   patterning a predetermined portion of the semiconductor substrate to form the source post;
   forming a conductive material on the semiconductor substrate, including the source post;
   forming a common source region by recessing the conductive material to a height that is less than a height of the source post;
   forming an insulating layer on the semiconductor substrate, including the common source region; and
   planarizing the insulating layer to expose an upper surface of the source post.

6. The method of claim 1, wherein the forming a semiconductor layer further comprises:
   growing, to a predetermined thickness, the source post to form the semiconductor layer on the insulating layer.

7. The method of claim 1, wherein the forming a semiconductor layer further comprises:
   forming an amorphous semiconductor layer on the insulating layer; and
   crystallizing the amorphous semiconductor layer to form the semiconductor layer.

8. The method of claim 1, further comprising:
   defining an active region by patterning the semiconductor layer in a first direction;
   forming a gate electrode structure on the active region; and
   forming a word line by patterning the gate electrode structure in a second direction perpendicular to the first direction.

9. The method of claim 8, further comprising:
   forming an impurity region at both side of the word line by implanting an impurity into the active region.

10. The method of claim 9, further comprising:
    forming an electrode and a data storage material on the impurity regions.

11. The method of claim 10, wherein one of the impurity regions is electrically connected to the semiconductor substrate and serves as a source region,
    the other of the impurity regions in contact with the insulating layer and serves as a drain region, and
    the electrode and the data storage material on the source region are insulated from each other.

12. The method of claim 1, further comprising:
   forming, before the forming an insulating layer, a common source region to a predetermined depth on the semiconductor substrate.

* * * * *